(12) United States Patent
Cheng et al.

(10) Patent No.: US 9,607,899 B1
(45) Date of Patent: Mar. 28, 2017

(54) INTEGRATION OF VERTICAL TRANSISTORS WITH 3D LONG CHANNEL TRANSISTORS

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/139,478

(22) Filed: Apr. 27, 2016

(51) Int. Cl.
| | | |
|---|---|---|
| *H01L 21/8234* | (2006.01) | |
| *H01L 29/66* | (2006.01) | |
| *H01L 27/085* | (2006.01) | |
| *H01L 29/06* | (2006.01) | |
| *H01L 29/78* | (2006.01) | |

(52) U.S. Cl.
CPC ........ *H01L 21/823487* (2013.01); *H01L 21/823481* (2013.01); *H01L 27/085* (2013.01); *H01L 29/0649* (2013.01); *H01L 29/66553* (2013.01); *H01L 29/66666* (2013.01); *H01L 29/7827* (2013.01)

(58) Field of Classification Search
CPC .......... H01L 21/823487; H01L 29/66666
See application file for complete search history.

(56) References Cited

U.S. PATENT DOCUMENTS

| | | | |
|---|---|---|---|
| 6,660,590 B2 | 12/2003 | Yoo | |
| 6,846,709 B1 | 1/2005 | Lojek | |
| 7,033,877 B2 | 4/2006 | Chaudhry et al. | |
| 7,205,601 B2 | 4/2007 | Lee et al. | |
| 7,282,772 B2 | 10/2007 | Anderson et al. | |
| 7,872,301 B2 | 1/2011 | Takaishi | |
| 8,466,511 B2 | 6/2013 | Oh et al. | |
| 8,847,298 B2 | 9/2014 | Thomas | |
| 9,165,935 B2 | 10/2015 | Chung et al. | |
| 2011/0108961 A1* | 5/2011 | Cheng ............. | H01L 21/033 257/623 |
| 2013/0270629 A1* | 10/2013 | Ikebuchi .......... | H01L 27/088 257/329 |
| 2014/0091403 A1* | 4/2014 | Masuoka ......... | H01L 29/4238 257/413 |
| 2015/0162438 A1 | 6/2015 | Chou et al. | |

* cited by examiner

*Primary Examiner* — Christine Enad
(74) *Attorney, Agent, or Firm* — Tutunjian & Bitetto, P.C.; Vazken Alexanian (57) ABSTRACT

A method for integrating a vertical transistor and a three-dimensional channel transistor includes forming narrow fins and wide fins in a substrate; forming a first source/drain (S/D) region at a base of the narrow fin and forming a gate dielectric layer and a gate conductor layer over the narrow fin and the wide fin. The gate conductor layer and the gate dielectric layer are patterned to form a vertical gate structure and a three-dimensional (3D) gate structure. Gate spacers are formed over sidewalls of the gate structures. A planarizing layer is deposited over the vertical gate structure and the 3D gate structure. A top portion of the narrow fin is exposed. S/D regions are formed on opposite sides of the 3D gate structure to form a 3D transistor, and a second S/D region is formed on the top portion of the narrow fin to form a vertical transistor.

20 Claims, 8 Drawing Sheets

INTEGRATION OF VERTICAL TRANSISTORS WITH 3D LONG CHANNEL TRANSISTORS

BACKGROUND

Technical Field

The present invention relates to semiconductor processing and integration, and more particularly to methods and structures including vertical transistors and long channel analog transistors integrated together on a same chip.

Description of the Related Art

Vertical field effect transistors (VFETs) provide a viable complementary metal oxide semiconductor (CMOS) architecture for node sizes beyond a 7 nm node. In a VFET, current flows vertically. One benefit of VFETs includes that a gate length (Lgate) is decoupled from a contact pitch so that close packed FETs can be made. In a typical system-on-chip (SoC), multiple gate lengths are needed. For example, Lgate of typical logic FETs is around 20 nm. In contrast, the Lgate of analog FETs is about 100-200 nm. Fabrication of a topography of 20 nm Lgate FETs and 200 nm Lgate FETs creates a tremendous challenge for processing.

SUMMARY

A method for integrating a vertical transistor and a three-dimensional channel transistor includes forming narrow fins and wide fins in a substrate; forming a first source/drain region (S/D) at a base of the narrow fin and forming a gate dielectric layer and a gate conductor layer over the narrow fin and the wide fin. A top spacer is deposited on the gate conductor layer. The gate conductor layer and the gate dielectric layer are patterned to form a vertical gate structure over the narrow fin and a three-dimensional (3D) gate structure over the wide fin. Gate spacers are formed over sidewalls of the vertical gate structure and the three-dimensional gate structure. A planarizing layer is deposited over the vertical gate structure and the 3D gate structure. A top portion of the narrow fin is exposed. S/D regions are formed on opposite sides of the 3D gate structure to form a 3D transistor, and a second S/D region is formed on the top portion of the narrow fin to form a vertical transistor.

Another method for integrating a vertical transistor and a three-dimensional channel transistor includes implanting dopants to form wells in a substrate; forming shallow trench isolation regions in the substrate; etching narrow fins and wide fins in the substrate; epitaxially growing a first source/drain region (S/D) at a base of the narrow fin; depositing a first spacer layer on the first S/D region; forming a gate dielectric layer and a gate conductor layer over the narrow fin and the wide fin; depositing a second spacer on the gate conductor layer; patterning the gate conductor layer and the gate dielectric layer to form a vertical gate structure over the narrow fin and a three-dimensional (3D) gate structure over the wide fin; forming gate spacers over sidewalls of the vertical gate structure and over sidewalls of three-dimensional gate structure; depositing a planarizing layer over the vertical gate structure and the 3D gate structure over the wide fin; exposing a top portion of the narrow fin; forming S/D regions on opposite sides of the 3D gate structure to form a 3D transistor and a second S/D region on the top portion of the narrow fin to form a vertical transistor; depositing an interlevel dielectric (ILD) over the 3D transistor and the vertical transistor; and forming contacts through the ILD down to the second S/D region and the S/D regions on opposite sides of the 3D gate structure.

An integrated device with vertical transistors and three-dimensional channel transistors includes a vertical transistor including a narrow fin vertical channel extending between vertically disposed source/drain (S/D) regions; and a vertical gate structure formed about the narrow fin and including a gate dielectric and a gate conductor and having a vertical gate length in a direction of a height of the narrow fin. A three-dimensional (3D) transistor includes a wide fin formed on a same substrate as the narrow fin; and a 3D gate structure formed over the wide fin and including the gate dielectric and the gate conductor of the vertical gate structure and having a gate length having a horizontal portion in a direction of a width of the wide fin and a vertical portion in a direction of a height of the wide fin.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, methods and structures for integrating vertical field effect transistors (FET) having short gate lengths and analog FETs with long gate lengths. In useful embodiments, one transistor type may include a logic FET and the other may include an analog FET. For example, a 3D analog FET reduces a footprint of analog circuits and thus chip size by providing a gate length or part of the gate length in the vertical direction. In some systems-on-a-chip (SoC), analog circuits may account for 50% of chip area. Therefore, a reduction in analog FET size helps to reduce the overall chip size and/or increase device density.

In accordance with useful embodiments, the vertical FETs and 3D analog FETs are made to share a substantial number of processes/elements. These common processes/elements are exploited to provide lower manufacturing costs and a space-efficient design that integrates functionality, e.g., logic FETs and analog FETs.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integer, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

For purposes of this disclosure, vertical shall mean in a direction perpendicular to a major surface of a semiconductor substrate and horizontal shall mean parallel with the major surface of the semiconductor substrate.

Figure 1:
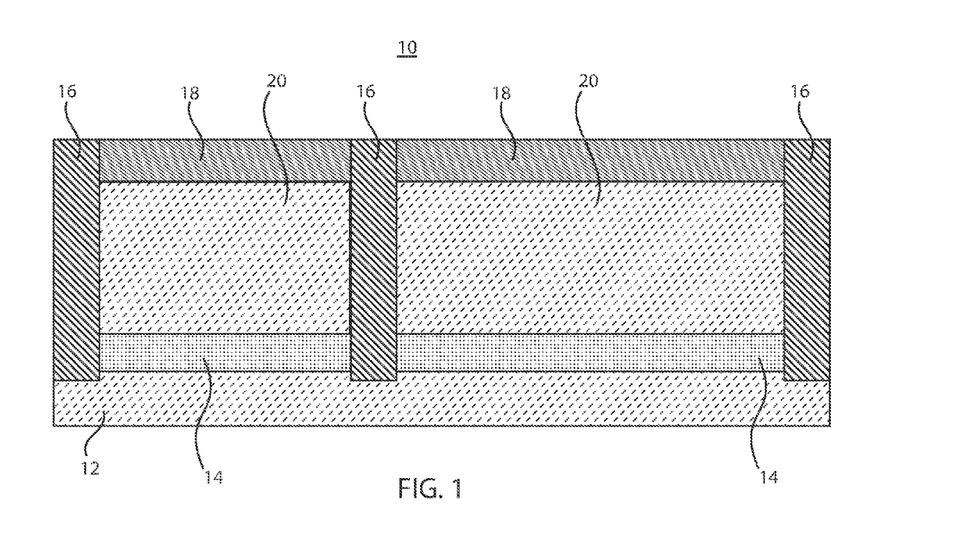
FIG. 1 is a cross-sectional view of a substrate of a device having buried wells, shallow trench isolation regions and a pad dielectric formed thereon in accordance with the present principles.

Referring now to the drawings in which like numerals represent the same or similar elements and initially to FIG. 1, a hybrid device 10 that includes logic and analog devices and, in particular, short gate length vertical devices and three-dimensional (3D) long gate length devices is shown in accordance with the present principles. The device 10 includes a substrate 12. The substrate 12 may include a bulk semiconductor material or a semiconductor layer of a semiconductor-on-insulator (SOI) substrate. The substrate 12 may include Si, SiGe, SiC, Ge, a III-V material (e.g., InP, InGaAs, GaAs, etc.) or any other suitable substrate material. In one particularly useful embodiment, the substrate 12 includes monocrystalline Si.

The embodiment depicted in FIG. 1 illustratively depicts a bulk substrate 12. The substrate 12 includes a well 14 formed in the substrate 12. The well 14 may be formed by an ion implantation process or other suitable doping process such as, e.g., solid phase doping. Thermal annealing can be performed after the doping process to activate dopants. In the embodiment shown, the well 14 may include a P-well for n-type FETs (NFETs) but may include an N-well in other embodiments for p-type FETs (PFETs), depending on the types of devices being fabricated.

A pad dielectric 18 is formed on a top portion 20 of the substrate 12. The pad dielectric 18 may include a silicon nitride (e.g., SiN), although other dielectric materials alone or in combination may be employed. The pad dielectric 16, top portion 20, well 14 and substrate 12 may be etched in accordance with a lithographic pattern to open up trenches for the formation of shallow trench isolation (STI) regions 16. The trenches are filled with a dielectric material, such as e.g., a silicon oxide, and planarized, using e.g., a chemical mechanical polishing (CMP) process to form the STI regions 16.

Figure 2:
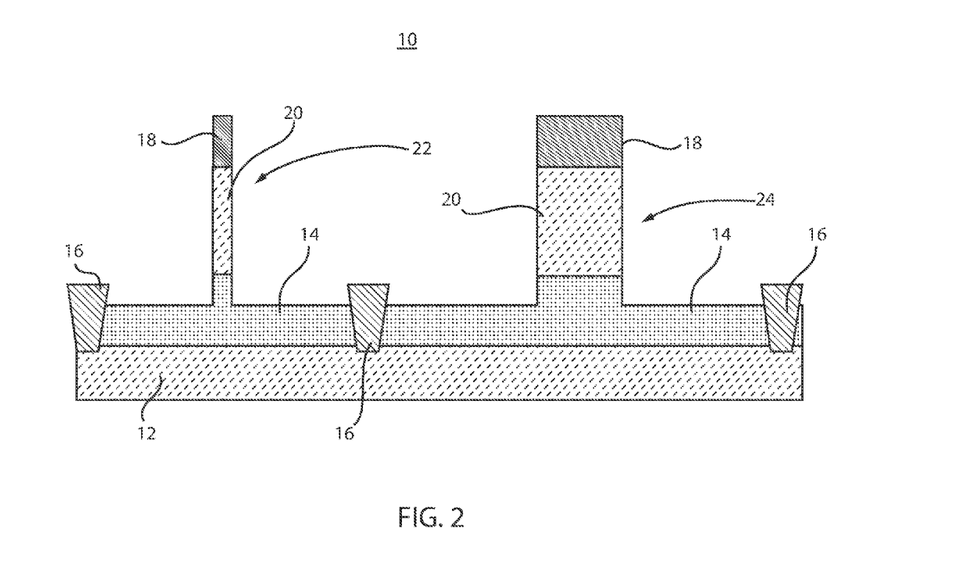
FIG. 2 is a cross-sectional view of the device of FIG. 1 having narrow and wide fins formed in the substrate in accordance with the present principles.

Referring to FIG. 2, the STI regions 16 are recessed by etching followed by the formation of fins 22 and 24. The fins 22, 24 are formed by patterning the pad dielectric 18 (and/or forming an etch mask (not shown) on the pad dielectric 18). The fin 22 is a narrower fin and etched into the well 14. The formation of fins 22 and 24 may include reactive ion etching (RIE) the top portion 20 of the substrate 12. The narrow fins 22 will be employed to form vertical logic FETs, while the wide fins 24 will be employed to form 3D analog FETs. In one embodiment, the width of the narrow fin 22 ranges from about 4 nm to about 20 nm, and the width of the wide fin 24 ranges from about 50 nm to about 500 nm. Other fin widths may also be employed.

Figure 3:
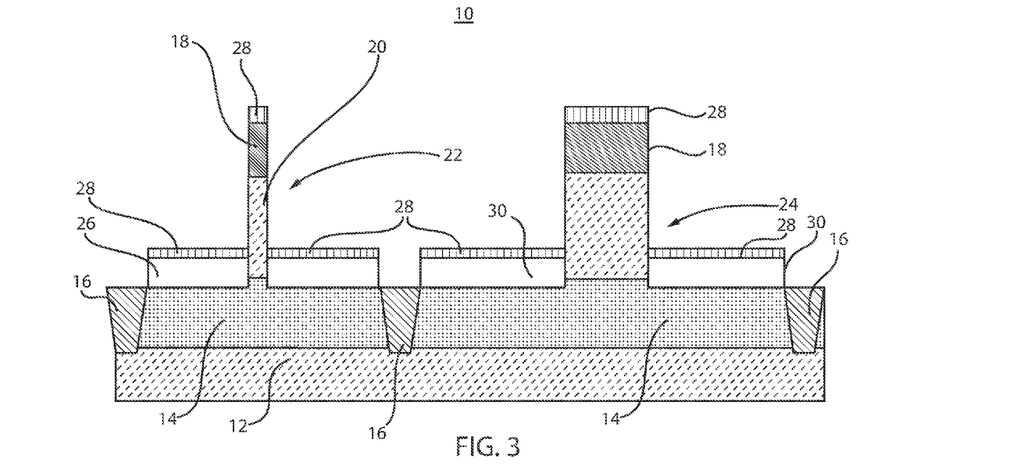
FIG. 3 is a cross-sectional view of the device of FIG. 2 having an epitaxially grown S/D region formed and a spacer layer directionally deposited in accordance with the present principles.

Referring to FIG. 3, at the base of the fins 22, 24, an epitaxial material is grown to form a source region 26 of the vertical FET on an exposed portion of the well 14 and at a base of the fin 22. Alternatively, the source region 26 can be formed by incorporating dopants in the source region 26, for example, by ion implantation followed by dopant activation annealing. While the source region or layer 26 is described as a source for the vertical transistor, a drain may be formed instead in some embodiments. An epitaxially grown material 30 is correspondingly grown on an exposed portion of the well 14 and at a base of the fin 24. The epitaxially grown material 26, 30 is preferably in-situ doped during the formation process.

For the epitaxially grown materials 26, 30, the epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material).

In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

The dopant concentration in layers 26 and 30 can be from about $1\times10^{19}$ cm$^{-3}$ to about $2\times10^{21}$ cm$^{-3}$, or preferably between $2\times10^{20}$ cm$^{-3}$ and $1\times10^{21}$ cm$^{-3}$. Other dopant concentrations may also be employed. When SiGe is epitaxially grown, the SiGe may have germanium content in the range of 5% to 80%, or preferably between 20% and 60%. Silicon and/or the SiGe may be doped with n-type dopants (e.g., phosphorus or arsenic) or p-type dopants (e.g., boron or gallium), depending on the type of transistor.

A spacer layer 28 is formed by a directional deposition method. The spacer layer 28 is formed on horizontal surfaces of the layer 18 and layers 26 and 30. The spacer layer 28 may be formed by a directional deposition process. The spacer layer 28 is preferably nitride, although other dielectric materials alone or in combination may be employed.

The directional deposition includes a film-forming gas introduced to a gas cluster ion beam (GCIB) to produce a film-forming GCIB, and a plurality of gas clusters collectively move together as the film-forming GCIB in a direction towards a target. A pressurized gas mixture is expanded into a reduced pressure environment to form gas-clusters, the gas-clusters are ionized, and the ionized gas-clusters are accelerated and optionally filtered.

The surfaces for deposition are exposed to the film-forming GCIB and, the direction of incidence of the GCIB is substantially perpendicular to the surface plane where the layer 28 is to be formed. The impact of multiple gas clusters on the one or more horizontal surfaces causes the formation of the deposited layer 28 on the one or more horizontal surfaces (e.g., on the layers 18, 26, 30), while causing substantially insignificant formation of a deposited film on the one or more vertical surfaces. Directional deposition can occur on any surface oriented to lie in a plane perpendicular to the direction of incidence of the GOB.

As the gas clusters collide with the one or more horizontal surfaces, material is infused in the surface layer or the underlying layer or is formed on the surface layer. As the GCIB dose is increased, the infusion of material transitions to the deposition of material on the surface. Amorphous films having a variety of material compositions that can be produced, and anisotropic (or directional) deposition can be achieved using the GCIB. Once the amorphous film is formed, it may be subjected to one or more thermal cycles (e.g., elevation of temperature) to crystallize the film. Besides GCIB, other directional deposition processes, such as, e.g., high density plasma (HDP) chemical vapor deposition (CVD), can be employed to deposit the layer 28. When needed, an etch back process can be used after deposition to remove any spacer material undesirably deposited on fin sidewalls.

Layer 28 compositions may include Si and O, Si and N; Si, C and N; Si, O and C; etc. For example, amorphous silicon oxide, amorphous silicon nitride, amorphous silicon oxynitride, amorphous silicon carbonitride, amorphous silicon oxycarbonitride, etc. can be formed. According to one example, layer 28 may include Si and N deposited using the introduction of silane ($SiH_4$), and a nitrogen-containing gas such as $N_2$ or $NH_3$ to a GCIB. According to another example, Si and O may be deposited using the introduction of silicon tetrafluoride ($SiF_4$), and an oxygen-containing gas such as $O_2$ to a GCIB. In yet another example, layer 28 may include Si, O and N deposited using the introduction of silicon tetrafluoride ($SiF_4$), an oxygen-containing gas such as $O_2$, and a nitrogen-containing gas such as $N_2$ or $NH_3$ to a GCIB. Alternatively, the oxygen-containing gas and the nitrogen-containing gas may include NO, $NO_2$, or $N_2O$, or a combination of two or more thereof. According to another example, layer 42 may include Si, O, N and C deposited using the introduction of silicon tetrafluoride ($SiF_4$), an oxygen-containing gas such as $O_2$, a nitrogen-containing gas such as $N_2$ or $NH_3$, and methane ($CH_4$) to a GCIB.

In any one of the examples provided above, additional gases can be provided including an inert gas, such as a noble gas. Gas mixtures may be selected based upon compatibility, stability or other criteria.

Figure 4:
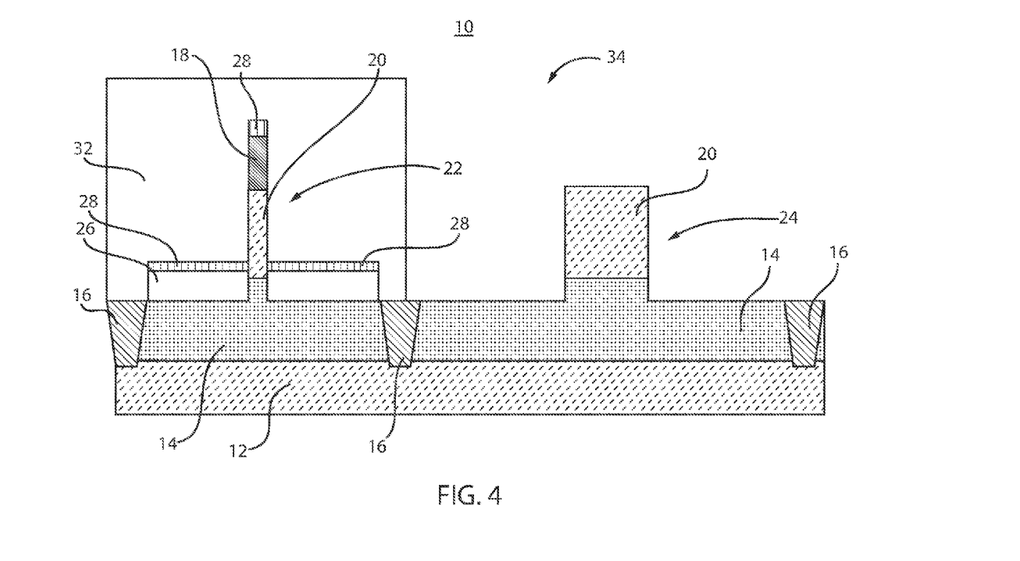
FIG. 4 is a cross-sectional view of the device of FIG. 3 having a vertical field effect transistor (FET) side masked and a 3D FET side etched to remove the S/D region in accordance with the present principles.

Referring to FIG. 4, the vertical FET is masked by a masking or blocking material 32. The masking material 32 may include a photoresist, an oxide, a nitride, etc. The masking material 32 is patterned to open up a region 34 for a 3D FET (analog device). The spacer layer 28, pad dielectric 18 and epitaxially grown material 30 are removed from the 3D FET region 34 by a suitable etch process.

Figure 5:
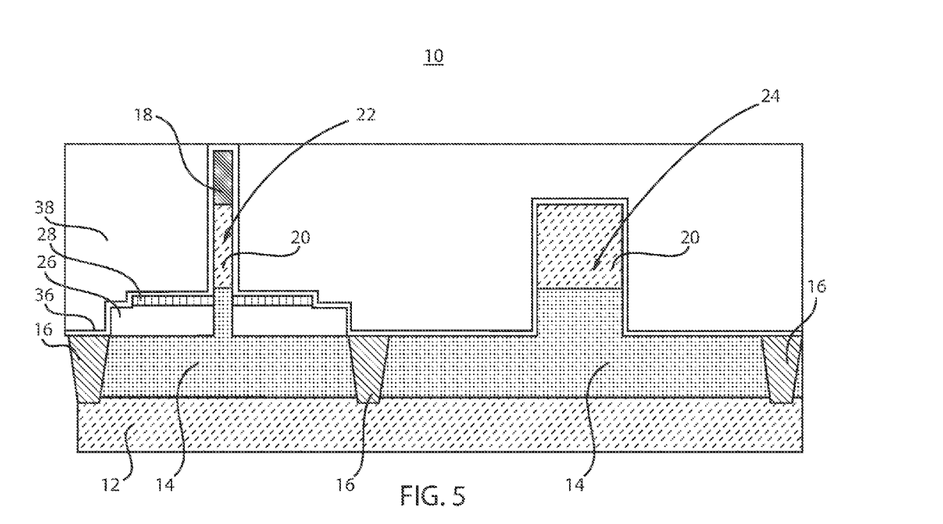
FIG. 5 is a cross-sectional view of the device of FIG. 4 having a gate dielectric and gate conductor formed on the vertical FET side and the 3D FET side in accordance with the present principles.

Referring to FIG. 5, a gate dielectric layer 36 is conformally formed over the device 10. The gate dielectric layer 36 may include a high-k material such as, e.g., hafnium dioxide, hafnium silicate, zirconium silicate, zirconium dioxide, etc. An interfacial layer such as silicon oxide, silicon oxynitride, etc. may be formed underneath the high-k gate dielectric to improve the interface quality. A gate conductor material 38 is deposited over the gate dielectric layer 36.

The gate conductor material 38 is formed over the gate dielectric layer 36. The gate conductor material 38 may include conductive materials, such as, e.g., a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), a carbon nanotube, conductive carbon, graphene, or any suitable combination of these materials. The conductive material may further comprise dopants that are incorporated during or after deposition. The gate conductor material 38 is planarized (e.g., CMP) down to the material 36 over the pad dielectric 18.

Figure 6:
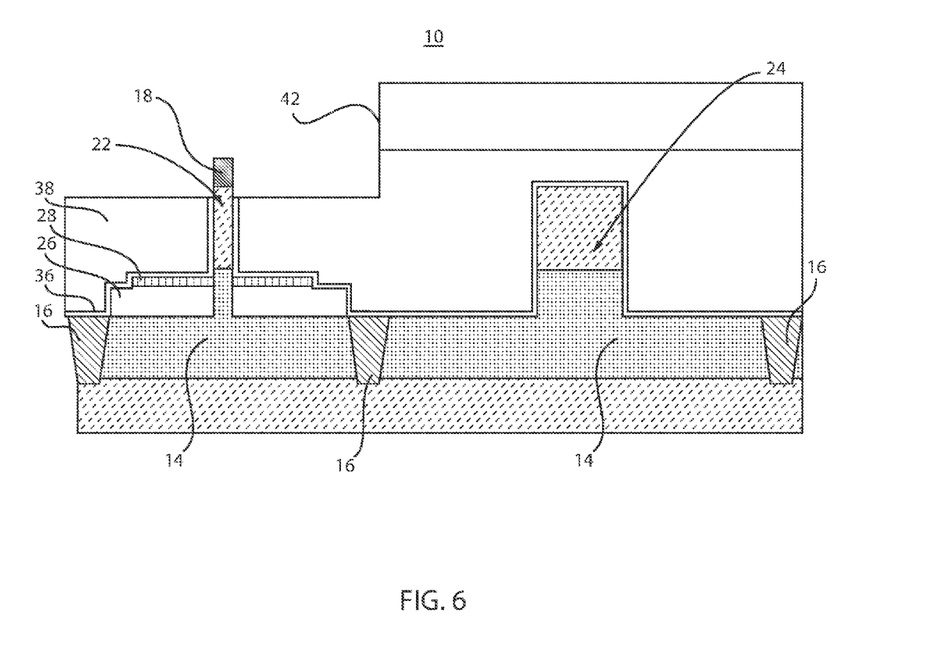
FIG. 6 is a cross-sectional view of the device of FIG. 5 having the gate conductor recessed on the vertical FET side in accordance with the present principles.

Referring to FIG. 6, a mask 42 is formed over the gate conductor material 38 and patterned to open up and recess the gate conductor material 38 in a vertical FET region 40. The recessing is performed by a selective etch relative to the gate dielectric 36. Then, another etch is performed to remove the gate dielectric material 36 exposed by recessing the gate conductor material 38. The mask 42 is then removed.

Figure 7:
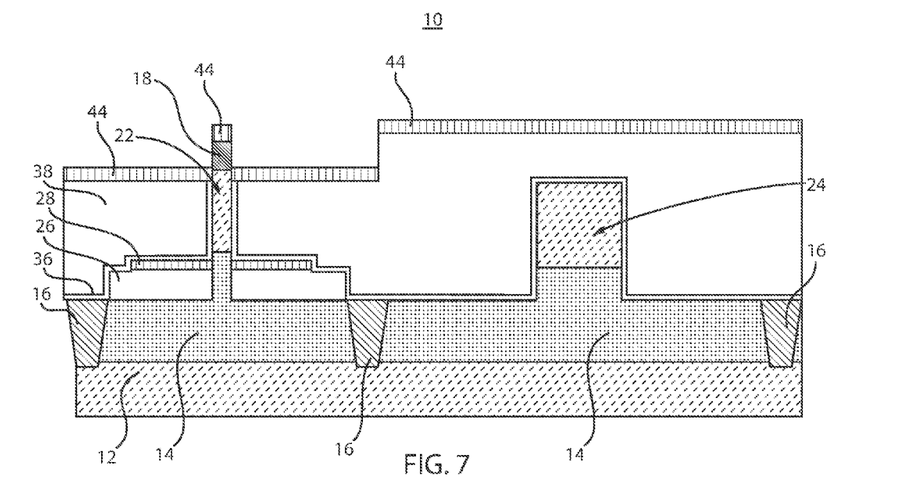
FIG. 7 is a cross-sectional view of the device of FIG. 6 having a spacer layer formed on the gate conductor in accordance with the present principles.

Referring to FIG. 7, a spacer layer 44 is formed by a directional deposition method on the gate conductor layer 38. The spacer layer 44 is formed on horizontal surfaces of the layer 38 and layer 18. The spacer layer 44 is preferably nitride, although other dielectric materials may be employed.

Figure 8:
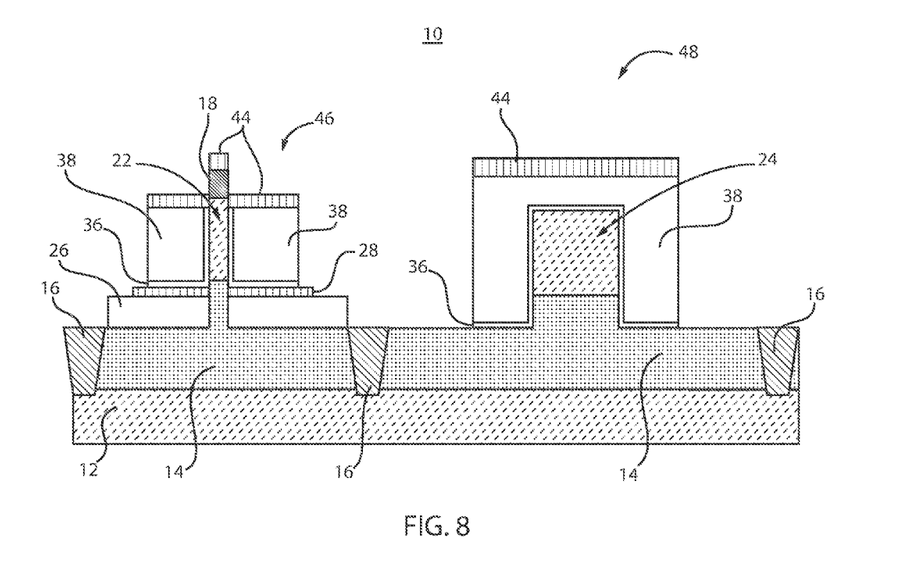
FIG. 8 is a cross-sectional view of the device of FIG. 7 having gate structures patterned for the vertical FET and the 3D FET in accordance with the present principles.

Referring to FIG. 8, a lithographic patterning process is performed to pattern gate structures. The spacer layer 44, gate conductor material 38 and gate dielectric material 36 are all etched in accordance with the pattern to form gate structure 46 for the vertical FET and gate structure 48 for the 3D FET.

Figure 9:
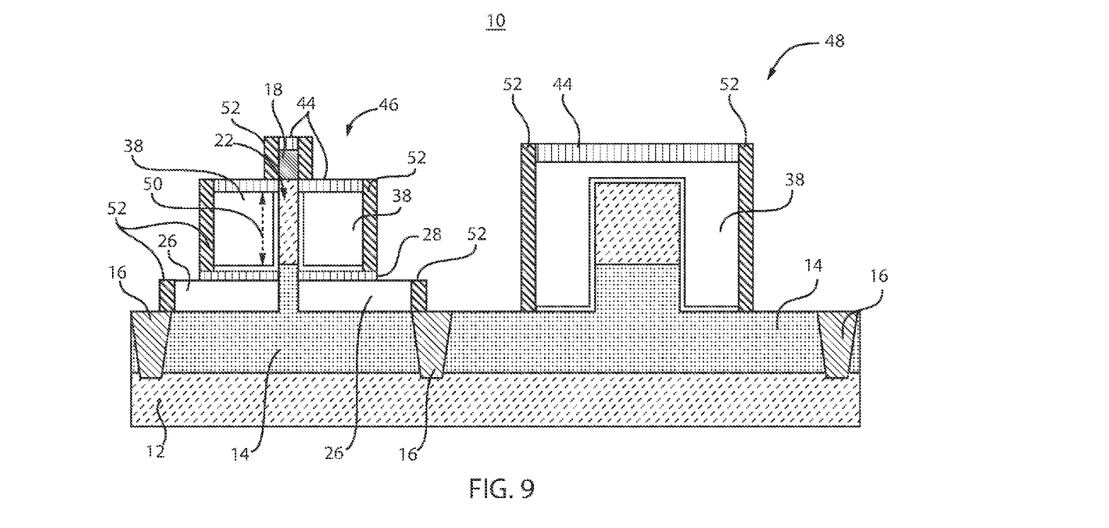
FIG. 9 is a cross-sectional view of the device of FIG. 8 having a vertical spacer formed on the gate structures for the vertical FET and the 3D FET in accordance with the present principles.

Referring to FIG. 9, vertical spacers 52 are formed by depositing a conformal layer over the structure 46 and 48. After deposition, RIE is performed to remove the layer 52 from horizontal surfaces to leave vertical portions of the layer to form the spacers 52. A gate length 50 is shown for the vertical FET 46.

Figure 10:
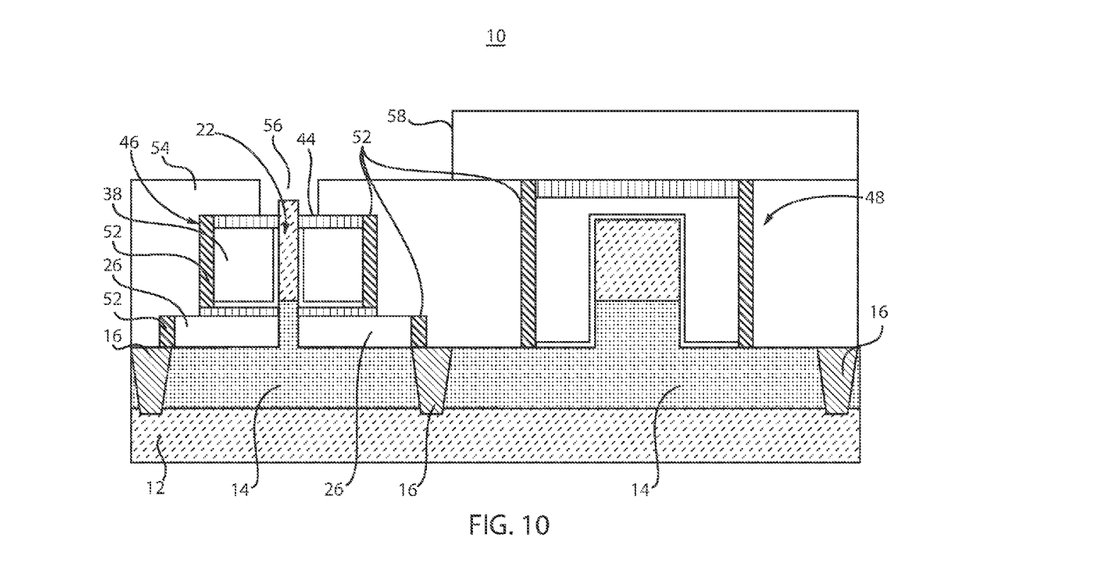
FIG. 10 is a cross-sectional view of the device of FIG. 9 having the 3D FET side masked and a narrow fin exposed for the vertical FET in accordance with the present principles.

Referring to FIG. 10, a planarizing layer 54 is deposited over the device 10 to fill in any recesses or spaces. The planarizing layer 54 may include an organic planarizing layer (OPL) although other dielectric layers may be employed (and planarized using, e.g., CMP). The 3D FET structure 48 is masked by forming a mask layer 58 over the planarizing layer 54 and patterning the mask layer 58 to remove the mask layer 58 from over the vertical FET 46. An etch process is performed to remove the spacer layer 44, spacers 52 and pad dielectric 18 to expose a top of the fin 22. The fin 22 is exposed to enable an epitaxial growth process to form a drain (or source) region for the vertical FET.

Figure 11:
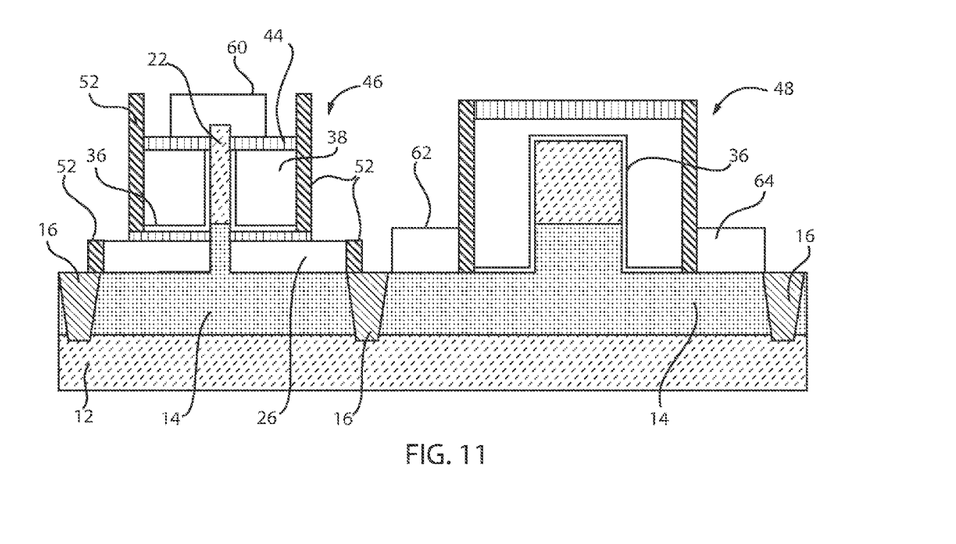
FIG. 11 is a cross-sectional view of the device of FIG. 10 having a S/D region epitaxially grown for the vertical FET in accordance with the present principles.

Referring to FIG. 11, the mask layer 58 and the planarizing layer 54 are removed by selective etching. The etching exposes the well 14 on a side for the 3D FET 48. An epitaxial growth process is performed to grow a drain (or source) region 60 for the vertical transistor 46 and form a drain region 62 and source region 64 for the 3D FET 48. Regions 60, 62, 64 may be in-situ doped and/or doped by other suitable techniques such as ion implantation, plasma doping, solid phase doping, etc. Some or all of the regions 60, 62, 64 may be formed and/or doped concurrently or sequentially using blocking masks, as needed.

Figure 12:
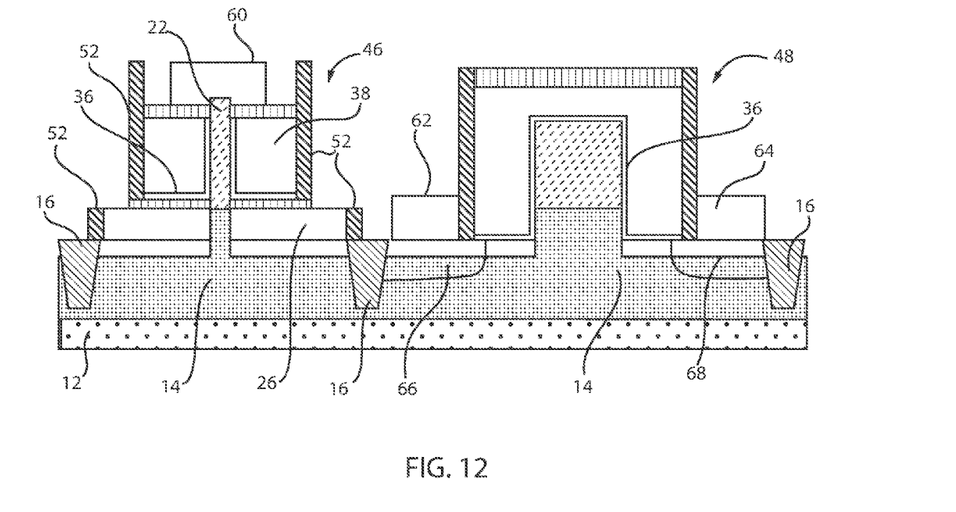
FIG. 12 is a cross-sectional view of the device of FIG. 11 having diffusion regions formed corresponding to S/D regions for the vertical FET and the 3D FET in accordance with the present principles.

Referring to FIG. 12, an anneal process may be performed to drive dopants form the doped regions 62, 64 and regions 26, 60 toward channel regions to form junctions. The anneal process may include temperatures between about 600 degrees C. to about 1300 degrees C. The anneal duration may range from 1 nanosecond to about 60 minutes, depending on the anneal temperature. Other temperatures and times may also be employed. The anneal process may include rapid thermal anneal (RTA), laser anneal, flash anneal, furnace anneal, etc. The anneal causes dopants to diffuse into the well 14 below the 3D FET 48 to form diffusion regions 66 and 68. Dopants also diffuse into fin 22 for the vertical FET 46. If the well 14 includes a p-well, the regions 66, 68, source 64 and drain 62 include n-type dopants (NFET). If the well 14 includes an n-well, the regions 66, 68, source 64 and drain 62 include p-type dopants.

Figure 13:
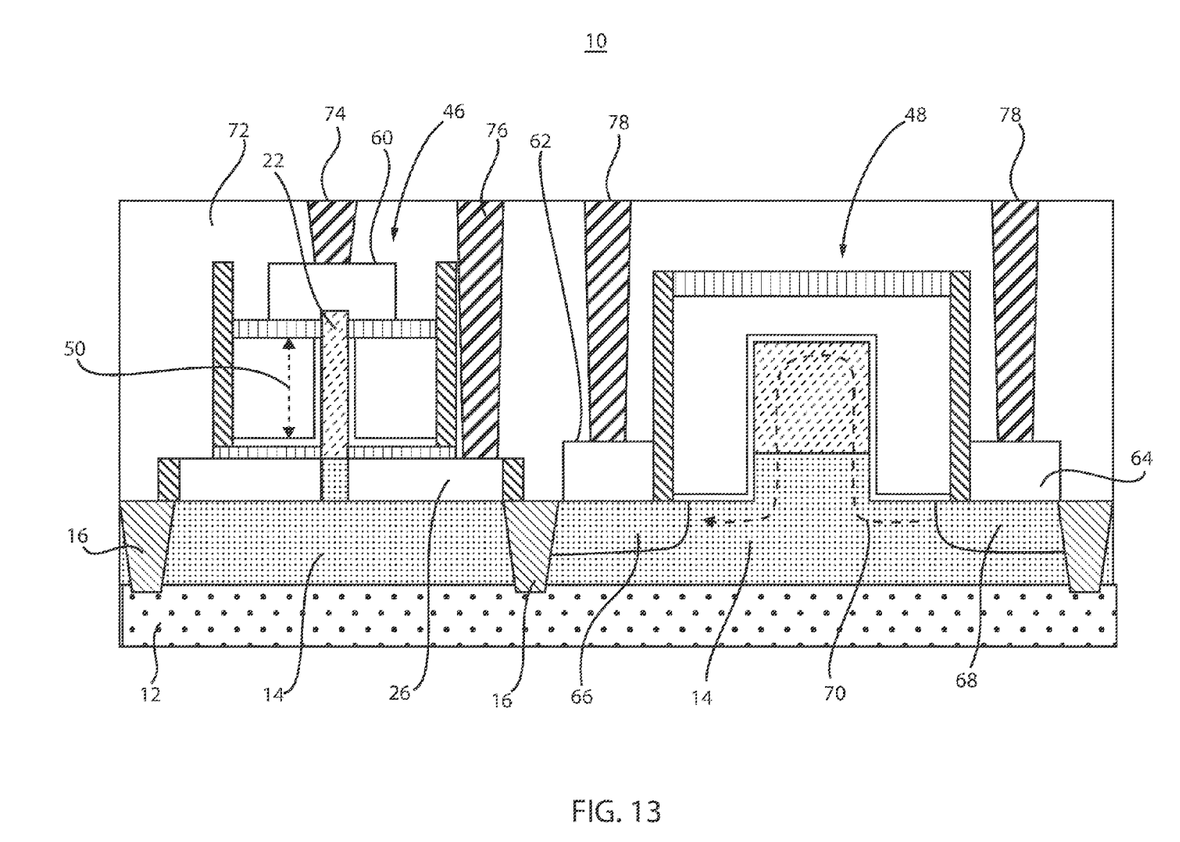
FIG. 13 is a cross-sectional view of the device of FIG. 12 having contacts formed to the S/D regions for the vertical FET and the 3D FET in accordance with the present principles.

Referring to FIG. 13, an interlayer dielectric (ILD) 72 is deposited and planarized on the device 10. The ILD 72 covers both the vertical FET regions (46) and the 3D FET regions (48). The ILD 72 may be deposited, spun-on, etc. and may include a silicon oxide, organic dielectric, and/or any other suitable dielectric materials. The ILD 72 is patterned to form contact holes. The contact holes are filled with conductive material to form contacts 74, 76 and 78. Contact 74 lands on drain region 60 for the vertical FET 46. Contacts 78 land on the drain region 62 and on the source region 64 of the 3D FET 48.

The contacts 74, 76 and 78 may include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

In accordance with the present principles, device 10 may include both logic devices (vertical FET 46) and analog devices (3D FET 48) on a same chip and integrated in a same processing sequence. The vertical FET 46 includes a gate length 50 that extends vertically to save chip area. The 3D FET 48 includes a gate length 70 that extends both horizontally and vertically to save chip area and provide a long channel transistor. It should also be understood that the device 10 may include NFETs and PFETs on the same device 10 as well.

Figure 14:
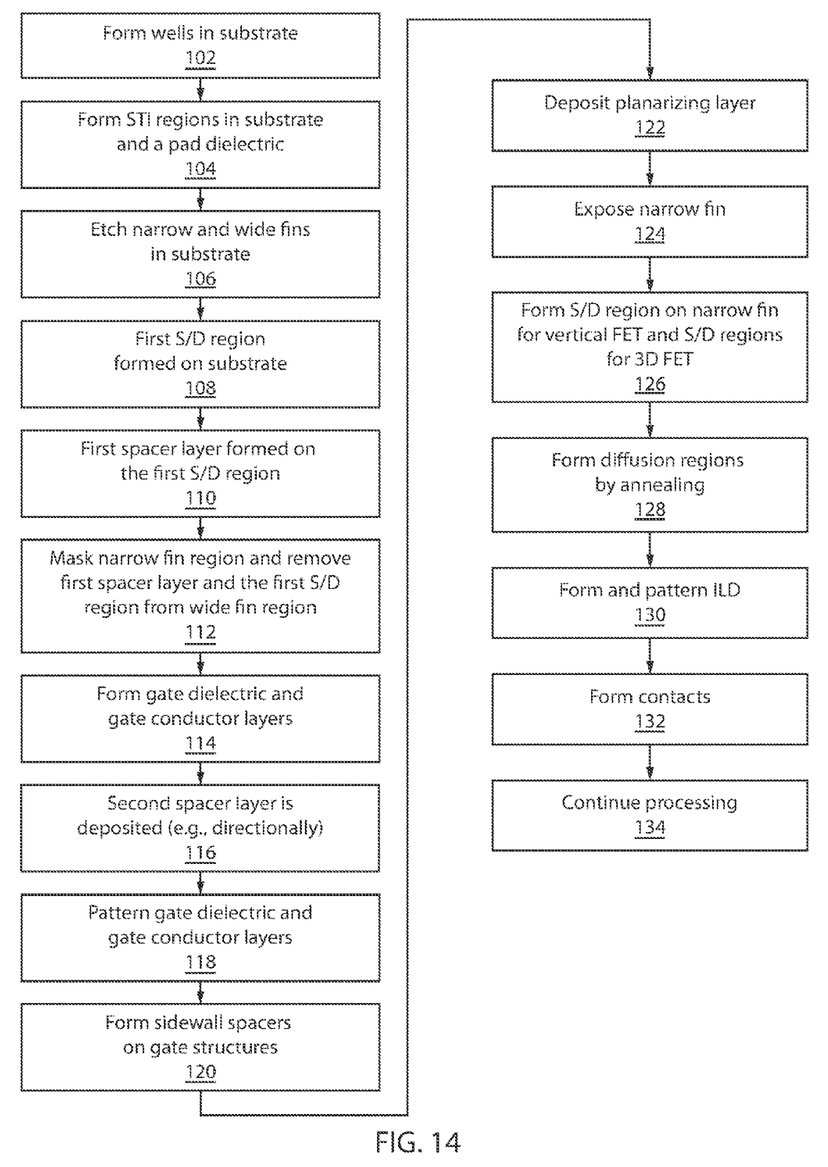
FIG. 14 is a block/flow diagram showing methods for integrating a vertical transistor and a three-dimensional channel transistor in accordance with illustrative embodiments.

Referring to FIG. 14, methods for integrating a vertical transistor and a three-dimensional channel transistor are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, dopants are implanted to form wells in a substrate. In block 104, shallow trench isolation (STI) regions are formed in the substrate. A pad dielectric may be formed on the substrate. In block 106, narrow fins and wide fins are etched in the substrate. In block 108, a first source/drain region (S/D) is epitaxially grown at a base of the narrow fin (and at the base of the wide fin). In block 110, a first spacer layer is deposited on the first S/D region. The first spacer layer may be directionally deposited on the first S/D region.

In block 112, the region with the narrow fins is masked to remove the spacer layer and the first S/D region at the base of the wide fin. In block 114, a gate dielectric layer and a gate conductor layer are formed over the narrow fin and the wide fin. In block 116, a second spacer is deposited on the gate conductor layer. The second spacer layer may be directionally deposited on the gate conductor layer.

In block 118, the gate conductor layer and the gate dielectric layer are patterned to form a vertical gate structure over the narrow fin and a three-dimensional (3D) gate structure over the wide fin. In block 120, gate spacers are formed over sidewalls of the vertical gate structure and over sidewalls of the three-dimensional gate structure. In block 122, a planarizing layer is deposited over the vertical gate structure and the 3D gate structure.

In block 124, a top portion of the narrow fin is exposed, e.g., by etching away, the dielectric materials formed on the narrow fin. In block 126, S/D regions are formed on opposite sides of the 3D gate structure to form a 3D transistor, and a second S/D region is formed on the top portion of the narrow fin to form a vertical transistor. The S/D regions on opposite sides of the 3D gate structure may be formed concurrently with the second S/D region (e.g., by epitaxial growth). The epitaxial growth may include in-situ doping. The vertical transistor includes a vertical gate length in a direction of a height of the narrow fin (e.g., approximately the fin height is the channel length and the gate length). The 3D transistor includes a gate length having a horizontal portion in a direction of a width of the wide fin and a vertical portion in a direction of a height of the wide fin.

In block 128, diffusion regions corresponding to the S/D regions are formed on opposite sides of the 3D gate structure in the substrate. The dopants in the S/D regions for the 3D FET (and the vertical FET) diffuse into semiconductor materials adjacent to the S/D regions to form junctions.

In block 130, an interlevel dielectric (ILD) is deposited and patterned over the 3D transistor and the vertical transistor. In block 132, contacts are formed through the ILD down to the second S/D region and the S/D regions on opposite sides of the 3D gate structure. In block 134, processing continues to complete the chip or system of a chip (SOC) device.

Having described preferred embodiments integration of vertical transistors with 3D long channel transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for integrating a vertical transistor and a three-dimensional channel transistor, comprising:
    forming narrow fins and wide fins in a substrate;
    forming a first source/drain (S/D) region at a base of the narrow fin;
    forming a gate dielectric layer and a gate conductor layer over the narrow fin and the wide fin;
    depositing a top spacer on the gate conductor layer;
    patterning the gate conductor layer and the gate dielectric layer to form a vertical gate structure over the narrow fin and a three-dimensional (3D) gate structure over the wide fin;
    forming gate spacers over sidewalls of the vertical gate structure and over sidewalls of three-dimensional gate structure;
    depositing a planarizing layer over the vertical gate structure and the 3D gate structure over the wide fin;
    exposing a top portion of the narrow fin; and
    forming S/D regions on opposite sides of the 3D gate structure to form a 3D transistor and a second S/D region on the top portion of the narrow fin to form a vertical transistor.

2. The method as recited in claim 1, further comprising directionally depositing a spacer layer on the first S/D region.

3. The method as recited in claim 1, wherein depositing the top spacer includes directionally depositing the top spacer.

4. The method as recited in claim 1, wherein the vertical transistor includes a vertical gate length in a direction of a height of the narrow fin.

5. The method as recited in claim 1, wherein the 3D transistor includes a gate length having a horizontal portion in a direction of a width of the wide fin and a vertical portion in a direction of a height of the wide fin.

6. The method as recited in claim 1, further comprising forming shallow trench isolation regions between the vertical transistor and the 3D transistor.

7. The method as recited in claim 1, wherein the S/D regions on opposite sides of the 3D gate structure are formed concurrently with the second S/D region.

8. The method as recited in claim 1, further comprising annealing to form diffusion regions corresponding to the S/D regions on opposite sides of the 3D gate structure in the substrate.

9. A method for integrating a vertical transistor and a three-dimensional channel transistor, comprising:
    implanting dopants to form wells in a substrate;
    forming shallow trench isolation regions in the substrate;
    etching narrow fins and wide fins in the substrate;
    epitaxially growing a first source/drain region (S/D) at a base of the narrow fin;
    depositing a first spacer layer on the first S/D region;
    forming a gate dielectric layer and a gate conductor layer over the narrow fin and the wide fin;
    depositing a second spacer on the gate conductor layer;
    patterning the gate conductor layer and the gate dielectric layer to form a vertical gate structure over the narrow fin and a three-dimensional (3D) gate structure over the wide fin;
    forming gate spacers over sidewalls of the vertical gate structure and over sidewalls of three-dimensional gate structure;
    depositing a planarizing layer over the vertical gate structure and the 3D gate structure over the wide fin;
    exposing a top portion of the narrow fin;
    forming S/D regions on opposite sides of the 3D gate structure to form a 3D transistor and a second S/D region on the top portion of the narrow fin to form a vertical transistor;
    depositing an interlevel dielectric (ILD) over the 3D transistor and the vertical transistor; and
    forming contacts through the ILD down to the second S/D region and the S/D regions on opposite sides of the 3D gate structure.

10. The method as recited in claim 9, further comprising directionally depositing the first spacer layer on the first S/D region.

11. The method as recited in claim 9, wherein depositing the second spacer layer includes directionally depositing the second spacer layer.

12. The method as recited in claim 9, wherein the vertical transistor includes a vertical gate length in a direction of a height of the narrow fin.

13. The method as recited in claim 9, wherein the 3D transistor includes a gate length having a horizontal portion in a direction of a width of the wide fin and a vertical portion in a direction of a height of the wide fin.

14. The method as recited in claim 9, wherein the S/D regions on opposite sides of the 3D gate structure are formed concurrently with the second S/D region.

15. The method as recited in claim 9, further comprising annealing to form diffusion regions corresponding to the S/D regions on opposite sides of the 3D gate structure in the substrate.

16. An integrated device with vertical transistors and three-dimensional channel transistors, comprising:
    a vertical transistor including:
        a narrow fin vertical channel extending between vertically disposed source/drain (S/D) regions; and
        a vertical gate structure formed about the narrow fin and including a gate dielectric and a gate conductor and having a vertical gate length in a direction of a height of the narrow fin; and
    a three-dimensional (3D) transistor including:
        a wide fin formed on a same substrate as the narrow fin; and
        a 3D gate structure formed over the wide fin and including the gate dielectric and the gate conductor of the vertical gate structure and having a gate length having a horizontal portion in a direction of a width of the wide fin and a vertical portion in a direction of a height of the wide fin.

17. The device as recited in claim 16, further comprising shallow trench isolation regions formed between the vertical transistor and the 3D transistor.

18. The device as recited in claim 16, wherein the 3D transistor includes S/D regions formed on opposite sides of the 3D gate structure.

19. The device as recited in claim 18, further comprising diffusion regions corresponding to the S/D regions on opposite sides of the 3D gate structure and formed in the substrate.

20. The device as recited in claim 16, wherein the 3D transistor includes an analog device and the vertical transistor includes a logic device.

* * * * *